United States Patent
Morii et al.

(10) Patent No.: US 10,494,712 B2
(45) Date of Patent: Dec. 3, 2019

(54) COPPER ALLOY SPUTTERING TARGET AND METHOD FOR MANUFACTURING SAME

(71) Applicant: JX Nippon Mining & Metals Corporation, Tokyo (JP)

(72) Inventors: Yasushi Morii, Ibaraki (JP); Tomio Otsuki, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 15/532,287

(22) PCT Filed: May 16, 2016

(86) PCT No.: PCT/JP2016/064442
§ 371 (c)(1),
(2) Date: Jun. 1, 2017

(87) PCT Pub. No.: WO2016/186070
PCT Pub. Date: Nov. 24, 2016

(65) Prior Publication Data
US 2017/0342546 A1  Nov. 30, 2017

(30) Foreign Application Priority Data

May 21, 2015 (JP) .................................. 2015-103701

(51) Int. Cl.
| | |
|---|---|
| C23C 14/34 | (2006.01) |
| C22C 9/00 | (2006.01) |
| C22C 9/01 | (2006.01) |
| C22C 9/05 | (2006.01) |
| C22F 1/08 | (2006.01) |
| C22C 1/02 | (2006.01) |
| H01J 37/34 | (2006.01) |
| C22F 1/00 | (2006.01) |
| H01L 21/285 | (2006.01) |
| B22D 7/00 | (2006.01) |
| C23C 14/16 | (2006.01) |
| H01L 21/768 | (2006.01) |

(52) U.S. Cl.
CPC .......... C23C 14/3414 (2013.01); B22D 7/005 (2013.01); C22C 1/02 (2013.01); C22C 9/00 (2013.01); C22C 9/01 (2013.01); C22C 9/05 (2013.01); C22F 1/08 (2013.01); C23C 14/165 (2013.01); C23C 14/34 (2013.01); H01J 37/3426 (2013.01); H01L 21/285 (2013.01); H01L 21/2855 (2013.01); H01L 21/28568 (2013.01); C22F 1/00 (2013.01); H01L 21/76873 (2013.01)

(58) Field of Classification Search
CPC combination set(s) only.
See application file for complete search history.

(56) References Cited

U.S. PATENT DOCUMENTS

| | | | | |
|---|---|---|---|---|
| 3,726,673 | A  * | 4/1973 | Greenwald | ............... C22C 9/00 |
| | | | | 420/489 |
| 6,391,081 | B1 * | 5/2002 | Uchikoshi | ............... C22B 4/005 |
| | | | | 75/10.19 |
| 6,451,135 | B1 | 9/2002 | Takahashi et al. | |
| 7,507,304 | B2 | 3/2009 | Okabe et al. | |
| 7,740,721 | B2 | 6/2010 | Okabe | |
| 8,192,596 | B2 | 1/2012 | Shindo et al. | |
| 8,216,442 | B2 | 7/2012 | Shindo et al. | |
| 8,246,764 | B2 | 8/2012 | Okabe et al. | |
| 9,028,658 | B2 | 5/2015 | Aoki et al. | |
| 9,090,970 | B2 | 7/2015 | Nagata et al. | |
| 9,165,750 | B2 | 10/2015 | Nagata et al. | |
| 9,441,289 | B2 | 9/2016 | Fukushima et al. | |
| 2005/0121320 | A1 | 6/2005 | Okabe et al. | |
| 2009/0065354 | A1 * | 3/2009 | Kardokus | ............. B22D 21/007 |
| | | | | 204/298.13 |
| 2009/0140430 | A1 | 6/2009 | Okabe et al. | |
| 2010/0000860 | A1 * | 1/2010 | Yuan | .......................... C22C 1/02 |
| | | | | 204/298.13 |

(Continued)

FOREIGN PATENT DOCUMENTS

| | | | |
|---|---|---|---|
| CN | 102703740 | A * | 10/2012 |
| EP | 0688879 | A1 | 12/1995 |
| JP | H08-92662 | A | 4/1996 |
| JP | H10-60632 | A | 3/1998 |
| JP | 2000-017345 | A | 1/2000 |
| JP | 2000-038622 | A | 2/2000 |
| JP | 2000-239836 | A | 9/2000 |
| JP | 2001051351 | A * | 2/2001 |
| JP | 2003-213407 | A | 7/2003 |

OTHER PUBLICATIONS

Translation to Lei (CN 102703740) published Oct. 2012 (Year: 2012).*

(Continued)

Primary Examiner — John J Brayton

(74) Attorney, Agent, or Firm — Howson & Howson LLP

(57) ABSTRACT

Provided is a copper alloy sputtering target, wherein, based on charged particle activation analysis, the copper alloy sputtering target has an oxygen content of 0.6 wtppm or less, or an oxygen content of 2 wtppm or less and a carbon content of 0.6 wtppm or less. Additionally provided is a method for manufacturing a copper alloy sputtering target, wherein a copper raw material is melted in a vacuum or an inert gas atmosphere, a reducing gas is thereafter introduced into the melting atmosphere, an alloy element is subsequently added to a molten metal for alloying, and an obtained ingot is processed into a target shape. The present invention aims to provide a copper alloy sputtering target that generates few particles during sputtering, and a method for manufacturing such a sputtering target.

8 Claims, No Drawings

(56) References Cited

U.S. PATENT DOCUMENTS

| | | | |
|---|---|---|---|
| 2010/0013096 A1 | 1/2010 | Irumata et al. | |
| 2010/0163425 A1* | 7/2010 | Shindo | C22B 15/0086 205/574 |
| 2010/0219070 A1 | 9/2010 | Okabe | |
| 2011/0123389 A1 | 5/2011 | Shindo et al. | |
| 2011/0163447 A1* | 7/2011 | Fukushima | C22C 9/00 257/741 |
| 2011/0192719 A1 | 8/2011 | Maki et al. | |
| 2011/0281134 A1 | 11/2011 | Maki et al. | |
| 2012/0328468 A1* | 12/2012 | Kumagai | C22F 1/08 420/469 |
| 2013/0302205 A1 | 11/2013 | Shindo et al. | |
| 2014/0010705 A1 | 1/2014 | Kanou | |
| 2014/0158532 A1 | 6/2014 | Nagata et al. | |
| 2014/0284211 A1 | 9/2014 | Nagata et al. | |
| 2014/0360869 A1 | 12/2014 | Otsuki et al. | |
| 2015/0034482 A1 | 2/2015 | Mori et al. | |
| 2015/0279638 A1 | 10/2015 | Otsuki et al. | |

OTHER PUBLICATIONS

Translation to Aoki (JP 2007-051351) published Feb. 2001 (Year: 2001).*

* cited by examiner

COPPER ALLOY SPUTTERING TARGET AND METHOD FOR MANUFACTURING SAME

BACKGROUND

The present invention relates to a copper alloy sputtering target and a method for manufacturing the same, and particularly relates to a sputtering target suitable for forming a thin film made of a copper alloy for use as a wiring in a semiconductor integrated circuit, and a method for manufacturing such a sputtering target.

Conventionally, while Al (specific resistance of roughly 3.1 μΩ·cm) has been used as the wiring material for semiconductor integrated circuits, pursuant to the refinement of wirings, Cu (specific resistance of roughly 1.7 μΩ·cm) with lower resistance has been put into practical application. As the process for forming a copper wiring, generally adopted is the method of forming a diffusion barrier layer made of Ta or TaN on a wiring layer or a wiring groove, and thereafter electroplating the copper. As the underlayer (seed layer) for performing the electroplating, copper or copper alloy is generally subject to sputter deposition.

Nevertheless, in case of forming a fine wiring of which width is 0.130 nm or less; for instance, 90 nm, 65 nm, 45 nm, or 20 nm, the seed layer will be an ultra-thin film of which thickness is less than the wiring width, but when forming such an ultra-thin seed layer, there is a problem in that a favorable seed layer cannot be formed due to the particles that are generated during sputtering. The formation of the seed layer is of importance, but defects such as disconnections are to be formed if particles exist in the seed layer.

The present applicant has previously proposed inventions related to high-purity copper or copper alloy sputtering targets for forming the wiring of semiconductor integrated circuits (refer to Patent Documents 1 to 3). While these inventions can prevent the generation of defects such as voids, hillocks and disconnections, yield low specific resistance, and offer EM resistance properties and oxidation resistance properties, the generation of particles caused by trace amounts of impurities in recent ultra-fine wirings is now regarded as a problem. Note that, while not directly related to the present application, Patent Documents 4 to 6 disclose methods for producing high-purity copper.

CITATION LIST

Patent Documents

Patent Document 1: WO 2004/083482
Patent Document 2: WO 2008/041535
Patent Document 3: Japanese Patent Application No. 2013-045838
Patent Document 4: JP 4680325 B
Patent Document 5: JP H08-092662 A
Patent Document 6: JP 2000-017345 A

SUMMARY

The present invention relates to a copper alloy sputtering target suitable for forming a thin film made of a copper alloy for use as a wiring in a semiconductor integrated circuit, and an object of this invention is to provide a copper alloy sputtering target that generates few particles during sputtering, and a method for manufacturing such a sputtering target.

In order to achieve the foregoing object, as a result of intense study, the present inventors discovered that, by devising the manufacturing method of the copper alloy ingot as the sputtering target material, it is possible to reduce the amount of oxygen and carbon contained in the copper alloy sputtering target, and thereby considerably suppress the generation of particles caused by such impurities during sputtering. The present invention provides the following invention to achieve the foregoing object.

1) A copper alloy sputtering target, wherein, based on charged particle activation analysis, the copper alloy sputtering target has an oxygen content of 0.6 wtppm or less, or an oxygen content of 2 wtppm or less and a carbon content of 0.6 wtppm or less.

2) The copper alloy sputtering target according to 1) above, wherein an alloy element is one or more types of elements having a higher affinity for oxygen or carbon in comparison to Cu.

3) A method for manufacturing a copper alloy sputtering target, wherein a copper raw material is melted in a vacuum or an inert gas atmosphere, a reducing gas is thereafter introduced into the melting atmosphere, an alloy element is subsequently added to a molten metal for alloying, and an obtained ingot is processed into a target shape.

4) The method for manufacturing a copper alloy sputtering target according to 3) above, wherein the reducing gas is made of hydrogen or carbon monoxide.

5) The method for manufacturing a copper alloy sputtering target according to 3) or 4) above, wherein the melting process is performed via plasma arc melting, electron beam melting, induction melting or the like.

6) The method for manufacturing a copper alloy sputtering target according to any one of 3) to 5) above, wherein each melting processing step is performed in a different crucible.

7) The method for manufacturing a copper alloy sputtering target according to any one of 3) to 6) above, wherein copper is placed into a water-cooled copper crucible and melted via plasma arc melting in an argon atmosphere, a hydrogen gas is thereafter introduced into the melting atmosphere, a molten metal is placed into a subsequent-stage water-cooled copper crucible, an alloy element is thereafter added thereto for alloying via plasma arc melting, an obtained ingot is subject to forging, rolling, and heat treatment to prepare a sputtering target material, and the prepared target material is machined and processed into a target shape.

The present invention yields superior effects of being able to considerably reduce impurities, particularly oxygen and carbon, contained in a copper alloy sputtering target, and suppress the generation of particles during sputtering.

DETAILED DESCRIPTION

The copper alloy sputtering target of the present invention is characterized in that, based on charged particle activation analysis, the copper alloy sputtering target has an oxygen content of 0.6 wtppm or less, or an oxygen content of 2 wtppm or less and a carbon content of 0.6 wtppm or less. Conventionally, known are techniques of melting a copper raw material to eliminate impurities such as metals and gasses, and thereby prepare high-purity copper. However, when attempting to prepare a high-purity copper alloy, there were cases where the oxygen or carbon contained in the copper would transfer to the alloy element, and remain therein. The present invention is able to reduce oxygen and carbon in the copper alloy extremely effectively by devising the manufacturing method.

The term "charged particle activation analysis" as used herein is one method of chemical analysis, in which a sample is irradiated with deuteron rays, neutron rays or γ rays to radioactivate the sample, and the radioisotope thereof is traced to perform a qualitative and quantitative analysis of the various elements contained in the sample. The present invention is able to significantly reduce the oxygen or carbon contained in the copper alloy sputtering target, and consequently effectively suppress the generation of particles during sputtering. Note that the quantitative lower limit based on the foregoing analyzing method is as follows; specifically, oxygen: 0.1 wtppm; carbon: 0.1 wtppm.

It goes without saying that the copper alloy of the present invention has a high purity, and the purity is preferably 99.999 wt % (5N) or higher. The purity is obtained by measuring the content of metal impurities excluding copper and alloy elements contained in the target via glow-discharge mass spectrometry (GDMS), and applying the subtracting method (deeming the result of subtracting metal impurities from 100 wt % as the purity wt %). The impurities are Ag, Al, Ca, Cr, Fe, K, Na, Ni, P, S, Th, and U.

As the alloy element configuring the copper alloy sputtering target of the present invention, preferably used is one or more types of elements having a higher affinity for oxygen or carbon in comparison to copper. For instance, considered may be Al, Mn, Co, Ni, Mg, Ti, Si, In, Sn, Ge, Bi, B, Cr, Nd, Zr, La, Er, Gd, Dy, Yb, Lu, Hf, and Ta. These alloy elements are well-known materials capable of improving the wiring properties of semiconductor devices, and a plurality of materials may also be combined and added to improve the properties. While the additive amount of these elements will differ depending on the required properties, for instance, the additive amount is preferably 0.1 to 15.0 at % for Al, and 0.1 to 30.0 at % for Mn.

The method of manufacturing the copper alloy sputtering target of the present invention is now explained. Foremost, copper and an alloy material (Al, Mn or the like) are prepared as the raw materials. These raw materials preferably have the highest purity possible, and it would be effective to use copper having a purity of 6N or higher, and an alloy element having a purity of 4N or higher. Subsequently, these raw materials are weighed to achieve the intended composition, and thereafter only the copper raw material is placed into a water-cooled copper crucible (including a hearth). While alumina, magnesia, graphite and other refractories are used as the crucible material, since they may get incorporated as impurities in the molten metal, it would be favorable to use copper having the same quality as the material to be subject to melting. Consequently, even if the crucible material becomes melted and gets mixed into the molten metal, it will not become an impurity.

Subsequently, the copper is melted in a vacuum or an inert gas (Ar, He or the like) atmosphere. Here, the volatilization of components can be suppressed by melting the copper in an inert gas atmosphere. Melting may be performed via plasma arc melting, electron beam melting, induction melting or the like. A reducing gas (hydrogen, carbon monoxide or the like) is thereafter introduced into the melting atmosphere. It is thereby possible to effectively eliminate the oxygen contained in the copper. As the amount of gas to be introduced, when adopting the plasma melting method, 0.1 to 20 vol % of reducing gas is preferably added to the inert gas. When adopting the electron beam melting method, the reducing gas is preferably introduced into the vacuum at a flow rate of 400 ml/min or more.

Here, the reducing gas is preferably added after melting the copper in a vacuum or an inert gas atmosphere and sufficiently desorbing the oxygen and carbon contained in the copper as carbon monoxide. After sufficiently eliminating carbon, excess oxygen can be desorbed as vapor ($H_2O$) or carbon dioxide ($CO_2$) by using the reducing gas, and carbon and oxygen contained as impurities in the copper can be reduced extremely effectively. Needless to say, the present invention is not restricting the addition of the reducing gas at a relatively early stage of melting copper (stage where carbon has not yet been sufficiently eliminated).

Subsequently, the obtained molten metal of copper is placed into a subsequent-stage water-cooled copper crucible (including a hearth), an alloy element is added, and a copper alloy is obtained via plasma arc melting, electron beam melting, induction melting or the like. What is particularly important is that the alloy element is added to the molten metal of copper after the elimination of oxygen and carbon, and then melted. If the alloy element is added to copper before the degassing process and then melted, the oxygen and carbon contained in the copper are incorporated into the alloy element and form oxides and carbides, and, even after the melting, these impurities will remain in the alloy ingot. Accordingly, the timing of adding the alloy element is extremely important.

Subsequently, the molten metal of copper alloy is placed into a water-cooled copper mold and melted via induction melting or the like, and the solidified ingot is extracted from the bottom of the mold. The surface layer of the prepared ingot is thereafter removed, and the ingot is subject to plastic working and heat treatment to produce a sputtering target material. Furthermore, the produced target material is machined and processed into a predetermined target shape so as to obtain a copper alloy sputtering target.

EXAMPLES

The present invention is now explained based on the Examples. The Examples indicated below are provided for facilitating the understanding of the present invention, and the present invention is not limited by these Examples. In other words, modifications and other examples based on the technical concept of the present invention are also covered by the present invention as a matter of course.

Example 1

Cu having a purity of 6N or higher was prepared, and the Cu was placed into a water-cooled copper hearth and melted via plasma arc melting of being irradiated with plasma in an argon atmosphere with 4 vol % of hydrogen introduced therein. Subsequently, the resulting molten metal was placed into another water-cooled copper hearth, and Al having a purity of 4N or higher was added to achieve an amount of 1 at %, and melted via plasma arc melting. Subsequently, the molten metal of copper alloy was poured into a water-cooled copper mold and melted via vacuum induction melting, and the solidified ingot was extracted from the bottom of the mold.

Subsequently, the obtained ingot was processed into a size having a diameter of 180 mm×thickness of 160 mm, thereafter subject to hot forging at 700° C., and additionally subject to cold rolling until the size became a diameter of 460 mm×thickness of 24.5 mm. This was thereafter subject to heat treatment at 400° C., and rapidly cooled to prepare a rolled plate. The rolled plate was machined to manufacture a sputtering target having a diameter of 440 mm and a thickness of 16.5 mm, and the manufactured sputtering target was bonded with a backing plate via diffusion bonding.

The impurity concentration in a part cut out of the ingot was examined. Note that metal components were measured using GDMS, and gas components (oxygen, carbon) were measured using charged particle activation analysis. Consequently, the total content of metal impurities was 1 wtppm or less, and, with regard to the gas components, the carbon content was 0.7 wtppm and the oxygen content was 0.3 wtppm. In particular, the concentration of oxygen as a gas component could be reduced considerably.

Sputtering was performed up to 100 kWh using the obtained target to deposit a film on a 12-inch silicon substrate at an input power of 38 kW for 5 seconds. As a result of measuring the number of particles having a size of 0.088 μm or larger in the deposited film, the result was favorable at 8 particles. Subsequently, as a result of measuring the number of particles on the substrate with regard to the respective Life positions of 200, 300, 500, and 800 kWh, the result was favorable at 10 particles or less throughout the entire Life of the target.

Example 2

Cu having a purity of 6N or higher was prepared, and the Cu was placed into a water-cooled copper hearth and melted via plasma arc melting of being irradiated with plasma in an argon atmosphere. Subsequently, 4 vol % of hydrogen was introduced into the melting atmosphere, and the Cu was further melted. Subsequently, the resulting molten metal was placed into a subsequent-stage water-cooled copper hearth, and Al having a purity of 4N or higher was added to achieve an amount of 1 at %, and melted via plasma arc melting. Subsequently, the molten metal of copper alloy was poured into a water-cooled copper mold and melted via vacuum induction melting, and the solidified ingot was extracted from the bottom of the mold.

Subsequently, the obtained alloy ingot was processed into a sputtering target according to the same method and conditions as Example 1, and the target was bonded with a backing plate via diffusion bonding. As a result of examining the impurity concentration in a part cut out of the ingot, the total content of metal impurities was 1 wtppm or less, and, with regard to the gas components, the carbon content was 0.2 wtppm and the oxygen content was 0.3 wtppm. The concentration of both carbon and oxygen as gas components could be reduced considerably. Furthermore, sputtering was performed using the obtained target in the same manner as Example 1, and the number of particles was measured. The result was favorable at 8 particles or less throughout the enter Life of the target.

Example 3

Cu having a purity of 6N or higher was prepared, and the Cu was placed into a water-cooled copper hearth and melted via electron beam melting in an atmosphere where hydrogen was introduced into a vacuum at a flow rate of 400 ml/min or more. Subsequently, the resulting molten metal was placed into a subsequent-stage water-cooled copper hearth, and high-purity Al having a purity of 4N or higher was added to achieve an amount of 1 at %, and melted via electron beam melting. Subsequently, the molten metal of copper alloy was poured into a water-cooled copper mold and melted via vacuum induction melting, and the solidified ingot was extracted from the bottom of the mold.

Subsequently, the obtained alloy ingot was processed into a sputtering target according to the same method and conditions as Example 1, and the target was bonded with a backing plate via diffusion bonding. As a result of examining the impurity concentration in a part cut out of the ingot, the total content of metal impurities was 1 wtppm or less, and, with regard to the gas components, the carbon content was 0.6 wtppm and the oxygen content was 0.8 wtppm. In particular, the concentration of carbon as a gas component could be reduced considerably. Furthermore, sputtering was performed using the obtained target in the same manner as Example 1, and the number of particles was measured. The result was 12 particles or less throughout the enter Life of the target. The results are shown in Table 1.

Example 4

Cu having a purity of 6N or higher was prepared, and the Cu was placed into a water-cooled copper hearth and melted via electron beam melting in a vacuum. Subsequently, hydrogen was introduced into the melting atmosphere at a flow rate of 400 ml/min or more, and the Cu was further melted. Subsequently, the resulting molten metal was placed into a subsequent-stage water-cooled copper hearth, and high-purity Al having a purity of 4N or higher was added to achieve an amount of 1 at %, and melted via electron beam melting. Subsequently, the molten metal of copper alloy was poured into a water-cooled copper mold and melted via vacuum induction melting, and the solidified ingot was extracted from the bottom of the mold.

Subsequently, the obtained alloy ingot was processed into a sputtering target according to the same method and conditions as Example 1, and the target was bonded with a backing plate via diffusion bonding. As a result of examining the impurity concentration in a part cut out of the ingot, the total content of metal impurities was 1 wtppm or less, and, with regard to the gas components, the carbon content was 0.2 wtppm and the oxygen content was 0.9 wtppm. In particular, the concentration of carbon as a gas component could be reduced considerably. Furthermore, sputtering was performed using the obtained target in the same manner as Example 1, and the number of particles was measured. The result was 10 particles or less throughout the enter Life of the target. The results are shown in Table 1.

TABLE 1

| | Alloy Element | Alloy composition at % | Melting method | Used gas | Method of adding alloy element | O value by radioactivation analysis wtppm | C value by radioactivation analysis wtppm | Number of sputtering particles |
|---|---|---|---|---|---|---|---|---|
| Example 1 | Al | 1 | Plasma melting | Ar + H$_2$ | Added after mixing | 0.3 | 0.7 | 10 particles or less |
| Example 2 | Al | 1 | Plasma melting | Ar ⇒ Ar + H$_2$ | Added after mixing | 0.3 | 0.2 | 8 particles or less |
| Example 3 | Al | 1 | Electron beam melting | H$_2$ | Added after mixing | 0.8 | 0.6 | 12 particles or less |
| Example 4 | Al | 1 | Electron beam melting | Vacuum ⇒ H$_2$ | Added alter mixing | 0.9 | 0.2 | 10 particles or less |

TABLE 1-continued

| | Alloy Element | Alloy composition at % | Melting method | Used gas | Method of adding alloy element | O value by radioactivation analysis wtppm | C value by radioactivation analysis wtppm | Number of sputtering particles |
|---|---|---|---|---|---|---|---|---|
| Example 5 | Al | 2 | Plasma melting | Ar + H$_2$ | Added after mixing | 0.4 | 0.7 | 12 particles or less |
| Example 6 | Al | 2 | Plasma melting | Ar ⇒ Ar + H$_2$ | Added after mixing | 0.4 | 0.3 | 7 particles or less |
| Example 7 | Al | 2 | Electron beam melting | H$_2$ | Added after mixing | 0.9 | 0.5 | 13 particles or less |
| Example 8 | Al | 2 | Electron beam melting | Vacuum ⇒ H$_2$ | Added after mixing | 1 | 0.2 | 8 particles or less |
| Example 9 | Al | 4 | Plasma melting | Ar + H$_2$ | Added after mixing | 0.4 | 1 | 9 particles or less |
| Example 10 | Al | 4 | Plasma melting | Ar ⇒ Ar + H$_2$ | Added after mixing | 0.4 | 0.4 | 7 particles or less |
| Example 11 | Al | 4 | Electron beam melting | H$_2$ | Added after mixing | 0.9 | 0.6 | 12 particles or less |
| Example 12 | Al | 4 | Electron beam melting | Vacuum ⇒ H$_2$ | Added after mixing | 1 | 0.2 | 11 particles or less |
| Example 13 | Mn | 1 | Plasma melting | Ar + H$_2$ | Added after mixing | 0.2 | 0.5 | 7 particles or less |
| Example 14 | Mn | 1 | Plasma melting | Ar ⇒ Ar + H$_2$ | Added after mixing | 0.3 | 0.2 | 5 particles or less |
| Example 15 | Mn | 1 | Electron beam melting | H$_2$ | Added after mixing | 1 | 0.4 | 8 particles or less |
| Example 16 | Mn | 1 | Electron beam melting | Vacuum ⇒ H$_2$ | Added after mixing | 1 | 0.1 | 7 particles or less |
| Example 17 | Mn | 2 | Plasma melting | Ar + H$_2$ | Added after mixing | 0.3 | 0.4 | 6 particles or less |
| Example 18 | Mn | 2 | Plasma melting | Arm ⇒ + H$_2$ | Added after mixing | 0.2 | 0.1 | 5 particles or less |
| Example 19 | Mn | 2 | Electron beam melting | H$_2$ | Added after mixing | 0.9 | 0.5 | 9 particles or less |
| Example 20 | Mn | 2 | Electron beam melting | Vacuum ⇒ H$_2$ | Added after mixing | 1 | 0.2 | 5 particles or less |
| Example 21 | Mn | 4 | Plasma melting | Ar + H$_2$ | Added after mixing | 0.3 | 0.4 | 8 particles or less |
| Example 22 | Mn | 4 | Plasma melting | Ar ⇒ Ar + H$_2$ | Added after mixing | 0.2 | 0.2 | 5 particles or less |
| Example 23 | Mn | 4 | Electron beam melting | H$_2$ | Added after mixing | 0.9 | 0.6 | 8 particles or less |
| Example 24 | Mn | 4 | Electron beam melting | Vacuum ⇒ H$_2$ | Added after mixing | 2 | 0.2 | 7 particles or less |
| Comparative Example 1 | Al | 1 | Plasma melting | Ar | Added after mixing | 10 | 0.2 | Up to 30 particles |
| Comparative Example 2 | Al | 1 | Plasma melting | Ar + H$_2$ | Added before mixing | 0.8 | 0.9 | Up to 20 particles |
| Comparative Example 3 | Al | 1 | Plasma melting | Ar ⇒ Ar + H$_2$ | Added before mixing | 1 | 0.9 | Up to 19 particles |
| Comparative Example 4 | Al | 1 | Electron beam melting | H$_2$ | Added before mixing | 3 | 1 | Up to 23 particles |
| Comparative Example 5 | Al | 1 | Electron beam melting | Vacuum | Added after mixing | 4 | 0.2 | Up to 26 particles |
| Comparative Example 6 | Al | 2 | Plasma melting | Ar | Added after mixing | 17 | 0.3 | Up to 28 particles |
| Comparative Example 7 | Al | 2 | Plasma melting | Ar + H$_2$ | Added before mixing | 1 | 2 | Up to 23 particles |
| Comparative Example 8 | Al | 2 | Plasma melting | Ar ⇒ Ar + H$_2$ | Added before mixing | 1 | 1 | Up to 21 particles |
| Comparative Example 9 | Al | 2 | Electron beam melting | H$_2$ | Added before mixing | 5 | 2 | Up to 27 particles |
| Comparative Example 10 | Al | 2 | Electron beam melting | Vacuum | Added after mixing | 7 | 0.2 | Up to 18 particles |
| Comparative Example 11 | Al | 4 | Plasma melting | Ar | Added after mixing | 25 | 0.3 | Up 10 40 particles |
| Comparative Example 12 | Al | 4 | Plasma melting | Ar + H$_2$ | Added before mixing | 2 | 2 | Up to 31 particles |
| Comparative Example 13 | Al | 4 | Plasma melting | Ar ⇒ Ar + H$_2$ | Added before mixing | 3 | 2 | Up to 22 particles |
| Comparative Example 14 | Al | 4 | Electron beam melting | H$_2$ | Added before mixing | 10 | 2 | Up to 30 particles |
| Comparative Example 15 | Al | 4 | Electron beam melting | Vacuum | Added after mixing | 16 | 0.3 | Up to 25 particles |
| Comparative Example 16 | Mn | 1 | Plasma melting | Ar | Added after mixing | 5 | 0.2 | Up to 15 particles |
| Comparative Example 17 | Mn | 1 | Plasma melting | Ar + H$_2$ | Added before mixing | 4 | 0.4 | Up to 18 particles |

TABLE 1-continued

| | Alloy Element | Alloy composition at % | Melting method | Used gas | Method of adding alloy element | O value by radioactivation analysis wtppm | C value by radioactivation analysis wtppm | Number of sputtering particles |
|---|---|---|---|---|---|---|---|---|
| Comparative Example 18 | Mn | 1 | Plasma melting | Ar ⇒ Ar + H$_2$ | Added before mixing | 6 | 0.5 | Up to 14 particles |
| Comparative Example 19 | Mn | 1 | Electron beam melting | H$_2$ | Added before mixing | 3 | 0.8 | Up to 17 particles |
| Comparative Example 20 | Mn | 1 | Electron beam melting | Vacuum | Added after mixing | 4 | 0.1 | Up to 14 particles |
| Comparative Example 21 | Mn | 2 | Plasma melting | Ar | Added after mixing | 9 | 0.1 | Up 10 21 particles |
| Comparative Example 22 | Mn | 2 | Plasma melting | Ar + H$_2$ | Added before mixing | 8 | 0.8 | Up to 16 particles |
| Comparatiw Example 23 | Mn | 2 | Plasma melting | Ar ⇒ Ar + H$_2$ | Added before mixing | 8 | 0.8 | Up to 19 particles |
| Comparative Example 24 | Mn | 2 | Electron beam melting | H$_2$ | Added before mixing | 6 | 0.7 | Up to 22 particles |
| Comparative Example 25 | Mn | 2 | Electron beam melting | Vacuum | Added after mixing | 6 | 0.2 | Up to 18 particles |
| Comparative Example 26 | Mn | 4 | Plasma melting | Ar | Added after mixing | 16 | 0.2 | Up 10 19 particles |
| Comparative Example 27 | Mn | 4 | Plasma melting | Ar + H$_2$ | Added before mixing | 13 | 1 | Up to 25 particles |
| Comparative Example 28 | Mn | 4 | Plasma melting | Ar ⇒ Ar + H$_2$ | Added before mixing | 11 | 1 | Up to 31 particles |
| Comparative Example 29 | Mn | 4 | Electron beam melting | H$_2$ | Added before mixing | 6 | 1 | Up to 23 particles |
| Comparative Example 30 | Mn | 4 | Electron beam melting | Vacuum | Added after mixing | 6 | 0.2 | Up to 16 particles |

Examples 5-12

As shown in Table 1, the additive amount of Al was changed to 2 at % (Examples 5-8) or 4 at % (Examples 9-12), and alloy ingots and sputtering targets were prepared according to the same method as Example 1, respectively. Consequently, in all cases, the total content of metal impurities was 1 wtppm or less, the carbon content was 1 wtppm or less, and the oxygen content was 1 wtppm or less. The concentration of gas components could be reduced considerably. Furthermore, sputtering was performed using the obtained targets in the same manner as Example 1, and the number of particles was measured. The result was favorable at 13 particles or less throughout the enter Life of the targets.

Examples 13-24

As shown in Table 1, Mn was used as the additive element, and the additive amount of Mn was changed to 1 at % (Examples 13-16), 2 at % (Examples 17-20), or 4 at % (Examples 21-24), and alloy ingots and sputtering targets were prepared according to the same method as Example 1, respectively. Consequently, in all cases, the total content of metal impurities was 1 wtppm or less, the carbon content was 0.6 wtppm or less, and the oxygen content was 2 wtppm or less. The concentration of gas components could be reduced considerably. Furthermore, sputtering was performed using the obtained targets in the same manner as Example 1, and the number of particles was measured. The result was favorable at 9 particles or less throughout the enter Life of the targets.

Comparative Example 1

High-purity Cu having a purity of 6N or higher was prepared, and the Cu was placed into a water-cooled copper hearth and melted via plasma arc melting of being irradiated with plasma in an argon atmosphere. Note that a reducing gas was not added. Subsequently, the resulting molten metal was placed into a subsequent-stage water-cooled copper hearth, and high-purity Al having a purity of 4N or higher was added to achieve an amount of 1 at %, and melted via plasma arc melting. Subsequently, the molten metal was poured into a water-cooled copper mold and melted via vacuum induction melting, and the solidified ingot was extracted from the bottom of the mold.

Subsequently, the obtained ingot was processed into a sputtering target according to the same method and conditions as Example 1, and the target was bonded with a backing plate via diffusion bonding. As a result of examining the impurity concentration in a part cut out of the ingot, with regard to the gas components, the carbon content was 0.2 wtppm and the oxygen content was 10 wtppm. The oxygen value was higher in comparison to the case of introducing hydrogen. Furthermore, sputtering was performed using the obtained target in the same manner as Example 1, and the number of particles was measured. The result was sporadic generation of numerous particles; specifically, up to 30 particles.

Comparative Example 2

Cu having a purity of 6N or higher and 1 at % of Al having a purity of 5N or higher were prepared and placed in a water-cooled copper hearth, and the Cu and Al were simultaneously melted via plasma arc melting of being irradiated with plasma in an argon atmosphere into which 4 vol % of hydrogen was introduced. Subsequently, the molten metal was poured into a water-cooled copper mold and melted via vacuum induction melting, and the solidified ingot was extracted from the bottom of the mold.

Subsequently, the obtained alloy ingot was processed into a sputtering target according to the same method and conditions as Example 1, and the target was bonded with a backing plate via diffusion bonding. As a result of examining the impurity concentration in a part cut out of the ingot, with regard to the gas components, the carbon content was 0.9 wtppm and the oxygen content was 0.8 wtppm. The values were slightly higher in comparison to the case of adding Al later. Furthermore, sputtering was performed using the obtained target in the same manner as Example 1, and the number of particles was measured. The result was sporadic generation of numerous particles; specifically, up to 20 particles.

Comparative Example 3

Cu having a purity of 6N or higher and 1 at % of Al having a purity of 5N or higher were prepared and placed in a water-cooled copper hearth, and the Cu and Al were simultaneously melted via plasma arc melting of being irradiated with plasma in an argon atmosphere. Subsequently, 4 vol % of hydrogen was introduced into the melting atmosphere, and the Cu and Al were further melted. Subsequently, the molten metal was poured into a water-cooled copper mold and melted via vacuum induction melting, and the solidified ingot was extracted from the bottom of the mold.

Subsequently, the obtained alloy ingot was processed into a sputtering target according to the same method and conditions as Example 1, and the target was bonded with a backing plate via diffusion bonding. As a result of examining the impurity concentration in a part cut out of the ingot, with regard to the gas components, the carbon content was 0.9 wtppm and the oxygen content was 1 wtppm. The values were slightly higher in comparison to the case of adding Al later. Furthermore, sputtering was performed using the obtained target in the same manner as Example 1, and the number of particles was measured. The result was sporadic generation of numerous particles; specifically, up to 19 particles.

Comparative Example 4

Cu having a purity of 6N or higher and 1 at % of Al having a purity of 5N or higher were prepared and placed in a water-cooled copper hearth, and the Cu and Al were simultaneously melted via electron beam melting in an atmosphere where hydrogen was introduced into a vacuum at a flow rate of 400 ml/min or more. Subsequently, the molten metal was poured into a water-cooled copper mold and melted via vacuum induction melting, and the solidified ingot was extracted from the bottom of the mold.

Subsequently, the obtained alloy ingot was processed into a sputtering target according to the same method and conditions as Example 1, and the target was bonded with a backing plate via diffusion bonding. As a result of examining the impurity concentration in a part cut out of the ingot, with regard to the gas components, the carbon content was 1 wtppm and the oxygen content was 3 wtppm. The values were higher in comparison to the case of adding a reducing gas. Furthermore, sputtering was performed using the obtained target in the same manner as Example 1, and the number of particles was measured. The result was sporadic generation of numerous particles; specifically, up to 23 particles.

Comparative Example 5

Cu having a purity of 6N or higher was prepared, and the Cu was placed into a water-cooled copper hearth and melted via electron beam melting in a vacuum. Note that a reducing gas was not introduced therein. Subsequently, the resulting molten metal was placed into a subsequent-stage water-cooled copper hearth, high-purity Al having a purity of 4N or higher was added to achieve an amount of 1 at %, and melted via electron beam melting. Subsequently, the molten metal was poured into a water-cooled copper mold and melted via vacuum induction melting, and the solidified ingot was extracted from the bottom of the mold.

Subsequently, the obtained alloy ingot was processed into a sputtering target according to the same method and conditions as Example 1, and the target was bonded with a backing plate via diffusion bonding. As a result of examining the impurity concentration in a part cut out of the ingot, with regard to the gas components, the carbon content was 0.2 wtppm and the oxygen content was 4 wtppm. The oxygen value was higher in comparison to the case of adding a reducing gas. Furthermore, sputtering was performed using the obtained target in the same manner as Example 1, and the number of particles was measured. The result was sporadic generation of numerous particles; specifically, up to 26 particles.

Comparative Examples 6-15

As shown in Table 1, the additive amount of Al was changed to 2 at % (Comparative Examples 6-10) or 4 at % (Comparative Examples 11-15), and alloy ingots and sputtering targets were prepared according to the same method as Comparative Example 1, respectively. Consequently, the oxygen content was 1 wtppm or more. The concentration of oxygen could not be reduced sufficiently. Furthermore, sputtering was performed using the obtained targets in the same manner as Example 1, and the number of particles was measured. The result was up to 18 particles or more, and the number of particles increased throughout the enter Life of the targets.

Comparative Examples 16-30

As shown in Table 1, Mn was used as the additive element, and the additive amount of Mn was changed to 1 at % (Comparative Examples 16-20), 2 at % (Comparative Examples 21-25, or 4 at % (Comparative Examples 26-30), and alloy ingots and sputtering targets were prepared according to the same method as Comparative Example 1, respectively. Consequently, the oxygen content was 3 wtppm or more. The concentration of oxygen could not be reduced sufficiently. Furthermore, sputtering was performed using the obtained targets in the same manner as Example 1, and the number of particles was measured. The result was up to 14 particles or more, and the number of particles increased throughout the enter Life of the targets.

The present invention can manufacture a copper alloy sputtering target containing extremely low amounts of oxygen and carbon, and, when this kind of sputtering target is subject to sputtering, it is possible to considerably suppress the generation of particles. The copper alloy sputtering target manufactured based on the present invention is particularly useful for forming a wiring film of semiconductor integrated circuits.

The invention claimed is:

1. A method for manufacturing a copper alloy sputtering target, wherein a copper raw material is melted in a water-cooled copper crucible or hearth under a vacuum or an inert gas atmosphere to obtain a molten copper, a reducing gas is thereafter introduced directly into the melting atmosphere to reduce oxygen content of the molten copper, thereafter the molten copper is translocated into another water-cooled copper crucible or hearth and an alloying element is subsequently added to the molten copper to obtain a molten copper alloy, and the molten copper alloy is cast to form a copper alloy ingot, which is then processed into a target shape to produce the copper alloy sputtering target having a purity of 99.999 wt % (5N) or higher and a total content of metal impurities of 1 wtppm or less and containing, as the alloying element, 0.1-15 at % of Al or 0.1-30 at % of Mn or both.

2. The method for manufacturing a copper alloy sputtering target according to claim 1, wherein the reducing gas is hydrogen gas or carbon monoxide gas.

3. The method for manufacturing a copper alloy sputtering target according to claim 2, wherein the melting of the copper raw material and the adding of the alloying element to the molten copper is performed using plasma arc melting, electron beam melting, or induction melting.

4. The method for manufacturing a copper alloy sputtering target according to claim 3, wherein the water-cooled copper crucible or hearth for melting the copper raw material is different from the water-cooled copper crucible or hearth in which the alloying element is added to the molten copper.

5. The method for manufacturing a copper alloy sputtering target according to claim 4, wherein the melting of the copper raw material and the adding of the alloying element to the molten copper are performed using plasma arc melting, and the processing of the copper alloy ingot includes steps of forging, rolling, and heat treatment to prepare a sputtering target material, which is machine-processed to form the target shape.

6. The method for manufacturing a copper alloy sputtering target according to claim 1, wherein the melting of the copper raw material and the adding of the alloying element to the molten copper is performed using plasma arc melting, electron beam melting, or induction melting.

7. The method for manufacturing a copper alloy sputtering target according to claim 1, wherein the water-cooled copper crucible or hearth for melting the copper raw material is different from the water-cooled copper crucible or hearth in which the alloying element is added to the molten copper.

8. The method for manufacturing a copper alloy sputtering target according to claim 1, wherein the melting of the copper raw material and the adding of the alloying element to the molten copper are performed using plasma arc melting and the processing of the copper alloy ingot includes steps of forging, rolling, and heat treatment to prepare a sputtering target material, which is machine-processed to form the target shape.

* * * * *